United States Patent [19]

Van Der Meulen et al.

[11] Patent Number: 5,758,646
[45] Date of Patent: Jun. 2, 1998

[54] MAGNETIC RESONANCE IMAGING METHOD WITH PULSE SEQUENCE OPTIMIZATION AND DEVICE FOR SUCH METHOD

[75] Inventors: Peter Van Der Meulen, Best; Jan Bruijns, Grave, both of Netherlands

[73] Assignee: U.S. Philips Corporation, New York, N.Y.

[21] Appl. No.: 625,832

[22] Filed: Apr. 1, 1996

Related U.S. Application Data

[63] Continuation of Ser. No. 304,735, Sep. 12, 1994, abandoned.
[51] Int. Cl.[6] .................................................. A61B 5/055
[52] U.S. Cl. ................................. 128/653.2; 324/309
[58] Field of Search ........................ 128/653.2; 324/307, 324/309

[56] References Cited

U.S. PATENT DOCUMENTS 4,835,690  5/1989  Gangarosa et al. ............... 364/413.13
5,189,371  2/1993  Conolly et al. ...................... 324/309
5,217,016  6/1993  Axel et al. ......................... 128/653.2
5,349,296  9/1994  Cikotte et al. ...................... 324/309

FOREIGN PATENT DOCUMENTS 0567794  11/1993  European Pat. Off. .

Primary Examiner—Brian L. Casler
Attorney, Agent, or Firm—Jack D. Slobod

[57] ABSTRACT

A method for magnetic resonance imaging is described in which imaging sequences, consisting of RF- and gradient magnetic field pulses (RF, $G_x$, $G_y$, $G_z$) are optimized with respect to a relevant parameter (SAR, signal-to-noise, etcetera) prior to applying the RF- and gradient pulse sequence to the object or patient (7) to be imaged. This reduces the amount of different sequences to a limited number of basic sequences from which an operator has to choose and allows adaptation of the sequence to the particular image to be obtained.

20 Claims, 4 Drawing Sheets

MAGNETIC RESONANCE IMAGING METHOD WITH PULSE SEQUENCE OPTIMIZATION AND DEVICE FOR SUCH METHOD

This is a continuation of application Ser. No. 08/304,735 filed Sep. 12, 1994 now abandoned.

BACKGROUND OF THE INVENTION

1. Field of the Invention

The invention relates to a method for magnetic resonance imaging of at least a portion of a body placed in a stationary and substantially homogeneous main magnetic field. The invention also relates to a device for performing such a method.

2. Description of the Related Art

In magnetic resonance imaging (MRI) pulse sequences are applied to an object (a patient) to generate magnetic resonance signals and obtain information therefrom which is subsequently used to reconstruct images of the object. Since its initial development, the number of clinical relevant fields of application of MRI has grown enormously. MRI can be applied to almost every part of the body and used to obtain information about a number of important functions, such as blood flow, heart functioning, brain activity and many others. For each function a set of MR pulse sequences is necessary. An MR pulse sequence determines completely the characteristics of the reconstructed images, such as location and orientation in a patient, dimensions, resolution, signal-to-noise ratio, contrast, sensitivity for movement, etcetera. To be able to obtain images for the different functions with various sets of characteristics, the availability of a large package of possible pulse sequences is necessary for operating an MRI device. An operator has to choose one particular sequence and the adaptation for a particular image is at most limited to the selection out of a set of values for no more than a few parameters.

In EP-A-0 567 794 an MRI device is disclosed in which a basic pulse sequence form is selected from a plurality of stored basic pulse sequence forms. The selected basic pulse sequence form is updated by means of pulse sequence parameters generated corresponding to desired imaging conditions. Subsequently, an appropriate pulse sequence is generated and simulated taking into account system and patient characteristics. From this simulation, which is a calculation starting from a Bloch equation, the effects of the generated pulse sequence are obtained and, subsequently, the pulse sequence is adjusted according to the results of the simulation.

As is stated in EP-A-0 567 794, by performing the known method with the help of a powerful computer to perform the necessary calculations in a short time, the number of measurements and the time needed for pulse sequence adjustment can be minimized. However, the known method does only adjust the sequence as to obtain the desired imaging conditions but has no effect upon the pulse sequences as such and the quality of the data acquired by measuring the generated magnetic resonance signals. The known method does not relieve the operator from detailed knowledge of the image obtainable by a specific sequence in order to make a proper selection. The known method does not optimise all variable parameters to obtain the best possible sequence.

SUMMARY OF THE INVENTION

It is, inter alia, an object of the invention to provide a method and a device for magnetic resonance imaging in which, with a minimum of operator assistance the quality of the data acquired can be maximized for a predetermined set of desired imaging conditions.

To this end, a method according to the invention comprises selecting an elementary sequence type of radio-frequency (RF) and magnetic field gradient pulses for generating magnetic resonance signals in an object;

selecting operational parameters which, in combination with the selected elementary sequence, describe desired imaging characteristics;

determining an operational sequence of RF and magnetic field gradient pulses by optimisation of said elementary sequence, taking into account machine constraints and said operational parameters;

subjecting said portion of a body to said operational sequence thereby generating magnetic resonance signals in said portion, measuring said magnetic resonance signals and obtaining from said measured signals an image of said portion of the body.

Operational parameters are, for example, field of view, slice thickness, echo or repetition time, location and orientation. Optimisation occurs with respect to a pertinent parameter, for example one that relates to image quality. Alternatively, parameters relating to total imaging time, temporal or spatial resolution, field or view, contrast in the image, short echo time, flow information, SAR (specific absorption rate) or acoustical noise, etcetera, can be chosen. As the optimisation process can be performed by running a program with a suitable algorithm in a computer, the operator can concentrate on the selection of the characteristics necessary for the desired image. He need not to attend to technicalities related to each of the many variations of an elementary pulse sequence in relation to the desired image conditions and the technical constraints of the MRI device.

Preferably, in the method of the invention the selection step is functionally separated from the optimisation step and the optimisation step is implemented in a way that its execution is independent from the determination of the operational sequence. By separating generation of pulse sequence from optimisation, the optimisation step can be implemented in a general way so that the introduction of new pulse sequences is possible without extensive reformulation of the optimisation algorithm.

In particular, in the method according to the invention the operational sequence is determined by an optimisation of the elementary sequence by maximising the period for measuring the generated magnetic resonance signals or the signal-to-noise ratio to be expected therein. The signal-to-noise ratio is an important parameter for determining image quality. The signal-to-noise ratio of the data samples acquired from the magnetic resonance signals increases with an increasing time period available for taking each sample.

In an embodiment of the method according to the invention, wherein first from an elementary sequence type a general description of the operational sequence is determined, said general description comprising the timing of RF-pulses and strength of magnetic field gradients applied simultaneously with the RF-pulses and secondly the optimisation is performed for determining the magnetic field gradient waveform in intervals not provided for in said general description. In this two step process the occurrence of RF-pulses at certain points in time and of magnetic gradient fields in certain intervals is established.

Subsequently, in the optimization process the detailed position, length and strength of the magnetic field gradients is determined in the other intervals of the pulse sequence.

In a further embodiment of the method according to the invention, wherein first from an elementary sequence type a general description of the operational sequence is determined and secondly the optimization is performed for determining the timing, length and strength of RF-pulses and magnetic field gradient waveforms. In this embodiment characteristics of the RF-pulses themselves are included in the optimization process as well. These characteristics can be optimized within certain limits, and optimisation with respect to RF-pulses is advantageous, for example, if the SAR has to be limited. SAR is proportional to the square of the RF-field and inversely proportional to its duration, while the effect of the RF-field on the magnetization is proportional to the time-integrated strength.

This embodiment can have as a further feature that the magnetic field gradient waveforms are piecewise linear functions. A piecewise linear function consists of a number of straight edges. As calculations involving linear functions are relatively fast, the optimization procedure can be performed with moderate computing power. Piecewise linear waveforms for magnetic field gradient allow a satisfactory approximation of any gradient waveform that would be desirable during imaging.

The invention also relates to an MRI device for performing an MRI method. Such an MRI device comprises means for establishing the main magnetic field, means for generating gradient magnetic fields superimposed upon the main magnetic field, means for radiating RF-pulses towards the body, control means for steering the generation of the gradient magnetic fields and the RF-pulses, means for receiving and sampling magnetic resonance signals generated by sequences of RF-pulses and switched gradient magnetic fields, and reconstruction means for forming an image from said signal samples, said control means further comprises

- a general description of a limited number of elementary sequences;
- an operator input section for entering operational parameters ($T_R$, $T_E$, position) describing desired characteristics of images to be obtained and for selecting an elementary sequence;
- calculation means for determining an operational sequence of RF and magnetic field gradient pulses by optimization of said elementary sequence, taking into account machine constraints and said operational parameters.

In a further embodiment of such a device the user control means comprises an output for communicating to the operator the result of the optimization of the sequence and for allowing the operator to apply additional parameters. This allows the operator to some extent to intervene in the optimization process if not a single solution is found. The operator can either decide which of several possible presented solutions should be used, or add, change or restrict any parameters if no solution can be found that complies with the desired setting.

These and other, more detailed, aspects of the invention will now be elucidated by way of example with reference to the accompanying drawings.

DETAILED DESCRIPTION OF THE PREFERRED EMBODIMENTS

Figure 1:
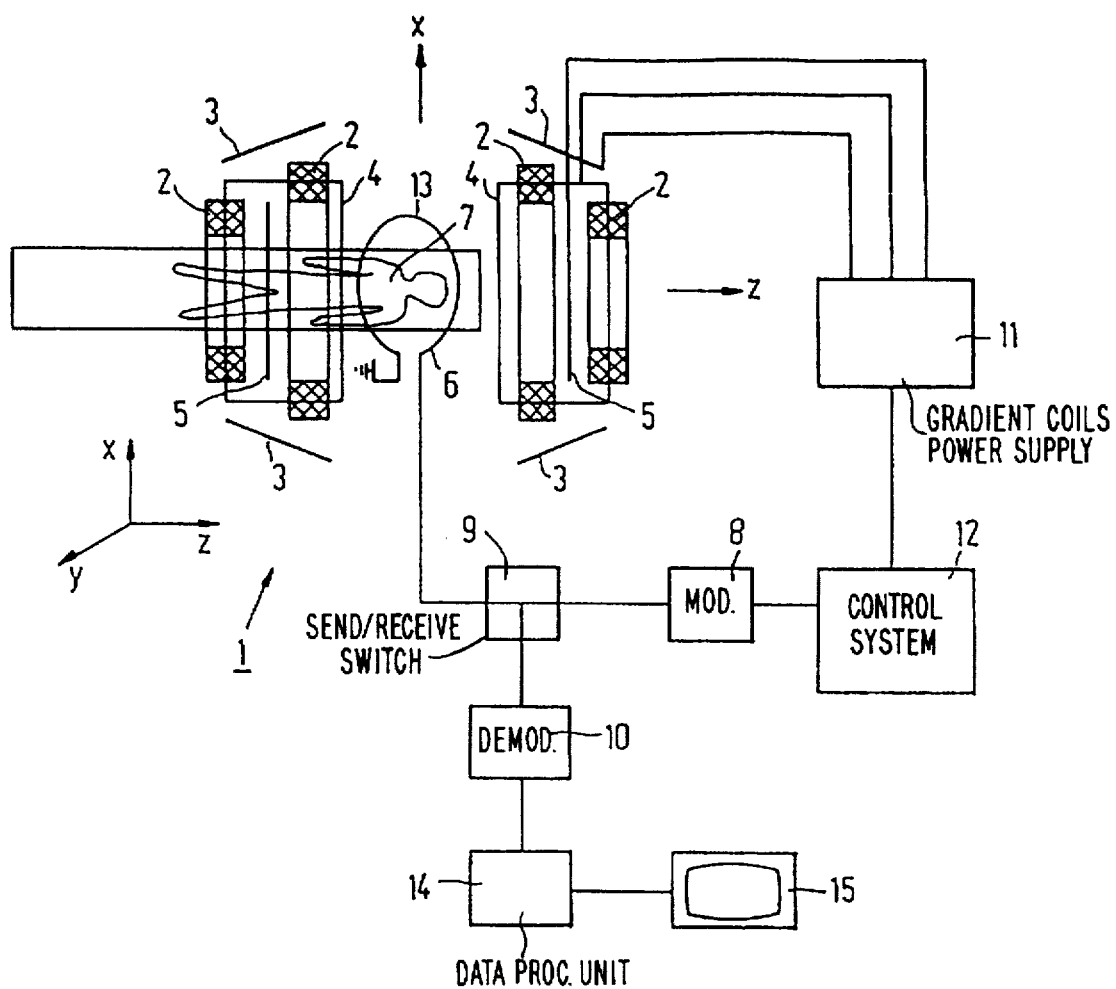
FIG. 1, diagrammatically a magnetic resonance imaging apparatus, suitable for the method according to the invention.

In FIG. 1 a magnetic resonance imaging apparatus 1 is diagrammatically shown. The apparatus comprises a set of main magnetic coils 2 for generating a stationary and homogeneous main magnetic field and three sets of gradient coils 3, 4 and 5 for superimposing additional magnetic fields with controllable strength and having a gradient in a selected direction. Conventionally, the direction of the main magnetic field is labelled the z direction, the two directions perpendicular thereto the x and y directions. The gradient coils are energised via a power supply 11. The apparatus further comprises radiation emitter 6, an antenna or coil, for emitting radio-frequency pulses (RF-pulses) to a body 7, the radiation emitter being coupled to a modulator 8 for generating and modulating the RF-pulses. Also provided is a receiver for receiving the NMR-signals, the receiver can be identical to the emitter 6 or be separate. If the emitter and receiver are physically the same antenna or coil as shown in the Figure, a send-receive switch 9 is arranged to separate the received signals from the pulses to be emitted. The received NMR-signals are input to a demodulator 10. The modulator 8, the emitter 6 and the power supply 11 for the gradient coils 3, 4 and 5 are steered by a control system 12 to generate a predetermined sequence of RF-pulses and magnetic field gradient pulses. The demodulator 10 is coupled to a data processing unit 14, for example a computer, for transformation of the received signals into an image that can be made visible, for example on a visual display unit 15.

If the magnetic resonance imaging apparatus 1 is put into operation with a body 7 placed in the magnetic field, a small excess of nuclear dipole moments or nuclear spins in the body will be aligned in the direction of the magnetic field. In equilibrium, this causes a net magnetization $M_0$ in the material of the body 7, directed in parallel with the magnetic field. This macroscopic magnetization $M_0$ is then manipulated by irradiating the body with RF-pulses having a frequency equal to the Larmor frequency of the nuclei, thereby bringing the nuclear dipole moments in an excited state and re-orienting the magnetization $M_0$. By applying the proper RF-pulses, a rotation of the macroscopic magnetization vector is obtained, the angle of rotation is called the flip-angle. The intentional introduction of variations in the magnetic field by applying gradient magnetic fields influences the resonance frequency and the magnetization locally. After application of a well chosen sequence of RF-pulses and magnetic field gradient pulses, NMR-signals are emitted from the body which signals provide information about the density of a certain type of nuclei, for example hydrogen nuclei, and the substance in which they occur. By analysis of the emitted signals and presentation thereof in the form of images, information about the internal structure of the body 7 is accessible. For more detailed descriptions of magnetic resonance imaging and MRI-devices reference is made to the extensive literature on this subject, for example to the book "Practical NMR Imaging", edited by M. A. Foster and J. M. S. Hutchison, 1987, IRL Press.

Figure 2:
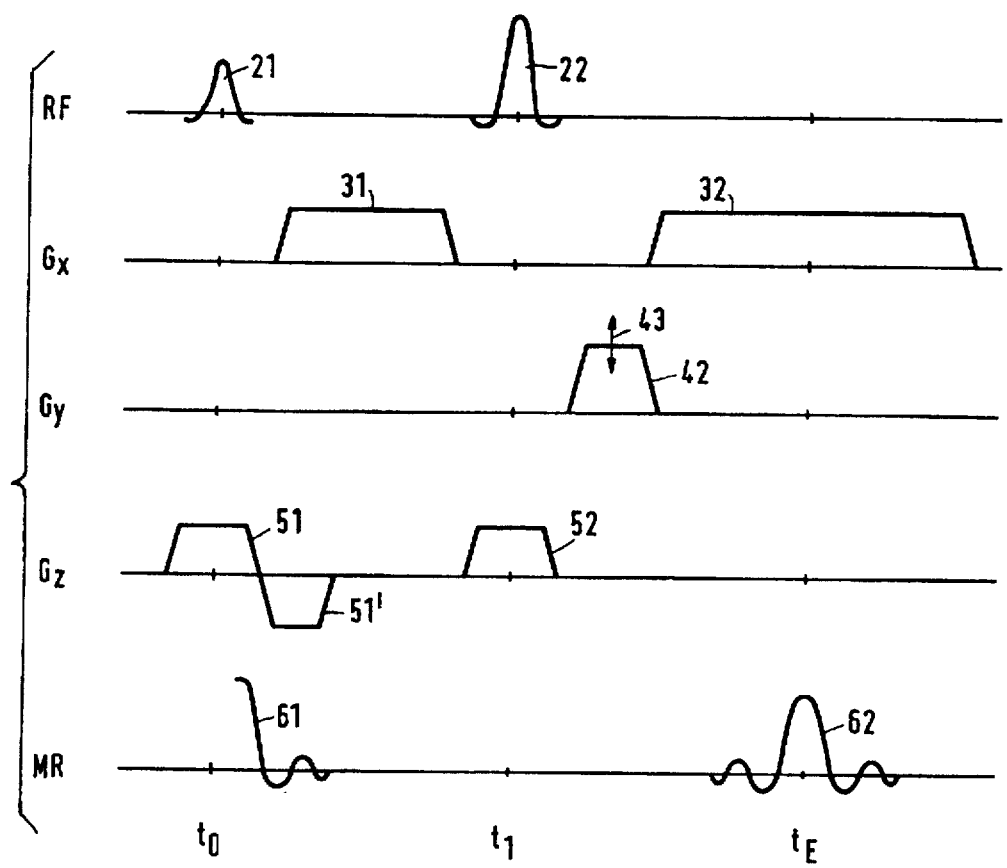
FIG. 2, a spin-echo (SE) sequence having an excitation RF-pulse, a refocusing RF-pulse and slice selection, phase encoding and measurement gradient pulses.

FIG. 2 shows, as an example, a so-called spin-echo (SE) sequence, consisting of an excitation RF-pulse and a refocusing RF-pulse. Other sequences such as FLASH, RARE, GRASE or EPI-spiral can be used as well. The Figure shows five rows, labelled RF, indicating the occurrence of RF-pulses as a function of time, $G_x$, $G_y$ and $G_z$, indicating the occurrence of magnetic gradient fields in the x-, y- and z-directions, directions, respectively, and MR, indicating the occurrence of the magnetic resonance signals in the body 7 caused by the RF and gradient pulses.

At time $t_0$ an excitation RF-pulse 21 is applied with a flip-angle α, followed at time $t_1$ by a refocusing RF-pulse 22 with a flip-angle β. The values of α and β are usually chosen to be 90° and 180°, respectively, other flip-angle values are, however, possible. Following the excitation RF-pulse 21, a free induction decay (FID) nuclear magnetic resonance signal 61, indicated in the row MR, is generated which vanishes rapidly when the individual precessing nuclear magnetic dipole moments loose phase coherence (dephase) due to local variations in the magnetic field. The refocusing RF-pulse 22 reverses the direction of these individual magnetic dipole moments without affecting the local magnetic field. Consequently, dephasing is reversed into a rephasing which, in the absence of magnetic field gradient pulses would result in an NMR spin-echo signal 62 at echo time $t_E$, a period $2(t_1-t_2)$ after $t_0$. The choice of the echo time $t_E$ is determined by the fact that different values for the echo time results in different contrasts of the various types of tissue in a body.

In order to provide spatial resolution in the acquired signal gradient magnetic fields in the x-, y- and z-directions are applied. The application of gradients 51 and 52 in the z-direction, simultaneous with the RF-pulses causes nuclear spins to be excited in only a slice. As this gradient creates a dephasing of the spins which varies in the direction perpendicular to the slice, a compensating field 51' with the gradient in the opposite direction is applied. For resolution in the x-direction, a magnetic field 31 with a gradient in the x-direction is applied prior to the refocusing RF-pulse 22, this gradient field causes an initial dephasing of the nuclear spins. After reversal of the spins by the refocusing RF-pulse 22 a magnetic field measurement gradient 32 is applied, such that a magnetic resonance signal 62 is generated with a space dependent frequency. Preferably, the two mentioned x-gradients 31 and 32 are chosen such that the time integrated strength thereof between $t_0$ and $t_1$ equals the time integrated strength between $t_1$ and $t_2$, there is no net effect of the x-gradient at time $t_2$ and a maximum spin echo signal is obtained. For spatial selection in the y-direction a gradient 42 is applied prior to the measurement of the NMR signal, before or after the refocusing RF-pulse, resulting in a relation between the phase of the NMR signal and the position in y direction of the source of the NMR signal. Combining repeated measurements with different values of the gradient in the y-direction, indicated with a vertical arrow 43, allow for a spatial resolution in the y-direction. Normally, a two-dimensional Fourier transform is used for the conversion of the measurements acquired with different time-integrated x- and y-gradients in a spatial image.

The quality of the acquired data increases with the amount of time available for each signal sample measured. This is because the signal-to-noise ratio is proportional to the square root of the length of the total measurement period. So it is desirable that the available measurement period is as long as possible while obeying the physical and technical constraints of the gradients. The main physical constraints are the need of avoiding any net dephasing effect of the gradient in the z-direction, the need to have a zero net dephasing effect between $t_0$ and $t_E$ of the gradient in the x-direction and the application of a fixed strength gradient in the z-direction as well as the absence of other gradients during the RF-pulses. The technical or machine constrains are the maximum gradient strengths and slopes that can be provided by the machine hardware. The present invention aims at providing a method to obtain the best signal within these constraints.

Additional features of the MRI sequence leading to different constraints are, for example, the requirement for flow compensation. Flow compensation can be obtained without sacrificing the parameter to be optimized, or, if desired, flow compensation can be improved at the expense of the optimum solution with respect to the parameter to be optimized. Further, in a sequence the relative times for the RF-pulses and the gradient fields are highly interlinked, allowing a reduction of the number of parameters involved in the optimisation procedure.

Since within these physical and technical constraints the number of possible gradient waveforms is virtually unlimited, additional constraints are necessary to limit the number of parameters that can be varied in the optimization process. These additional constraints are not fundamental and can be replaced by others or removed if the optimization algorithm such allows. A first possible additional constraint prescribes trapezium shaped magnetic field gradients with fixed rising and falling times. The amount of parameters is now limited, the relations between the parameters is linear and there are one or two nonlinear inequality constraints, following from the gradient slopes and strengths which should not exceed their maximum possible values.

In a first method to search for an optimum solution the duration of the measurement gradient is set to its maximum value, i.e. for a symmetric refocusing RF-pulse 22 equal to $2(t_E-t_1-\Delta)$, in which $\Delta$ is half the length of the RF-pulse. Subsequently, it is searched whether there is any solution for the other gradients compatible herewith. If no solution can be found the length of the measurement gradient is decreased by a small step δ and a new attempt to find any solutions is made. This is repeated till a possible solution is found. To accomplish the variation in the phase encoding gradient, a solution is searched for the two extreme values thereof. The solution with the shortest length of the measurement gradient 32 is then taken as the overall solution.

For more complicated sequences, such as sequences in which echoes are generated by a gradient field, TSE (turbo spin echo) or RARE (rapid acquisition by repeated echoes) comprising a plurality of refocusing RF-pulses causing a repetition of magnetic resonance signals, EPI (echo planar imaging) having alternating polarity measurement gradients or GRASE (gradient and spin echo) having alternating polarity measurement gradients and repeated refocusing RF-pulses, similar sets of constraints can be formulated and a similar technique of searching for a solution can be applied.

This solution method has some disadvantages. Firstly, as new imaging techniques in MRI with improved image quality and acquisition time reduction are constantly being developed, new physical constraints are likely to be implemented. For each new constraint introduced, the method has to be adapted. Due to the probable non-linearity of such constraints any significant adjustment of the method will be difficult to make. Secondly, as only a limited number of parameters is varied and only a single possible solution is searched, this solution need not be the optimum solution that could be obtained with the use of more parameters. Finally, because of the discrete step $\delta$, the optimum value is bound to be inaccurate. Any increase in accuracy by choosing a smaller value for $\delta$ increases the calculation time.

In a second embodiment of the method according to the invention a more flexible formulation of the set of constraints, in particular allowing for a larger number of parameters and for non-linear constraints is proposed. A general formulation of such an optimization problem is determining the minimum of a (non-linear) object function $f(x_1, \ldots, x_n)$, subject to (non-linear) constraints functions: $c_j(x_1, \ldots, x_n)=0$ for $j=1, \ldots, m_1$ and $c_j(x_1, \ldots, x_n) \leq 0$ for $j=m_1+1, \ldots, m$. The solution of such a system can, for example, be found by the sequential quadratic programming method, described in P. E. Gill et al., "Practical Optimization", Academic Press, London (1981). This method is implemented in the routine "E04UCF" of the NAG Fortran Library (The NAG Fortran Library Manual Mark 15, 1st edition (June 1991), The Numerical Algorithm Group Limited, Oxford). Other standard available optimization routines could be used as well.

In this embodiment the gradient magnetic fields are given as piecewise linear waveforms, i.e. continuous functions composed of linear segments. The nodes where the linear segments join are imposed to coincide in time in the gradient waveforms in each of the x-, y- and z-directions. Although this is a more flexible model than the first embodiment described, in particular, the introduction of additional constraints does not necessitate a reformulation of the whole model, the required limitations are such that in some cases the global optimum cannot be found.

In principle, the waveform of the magnetic field gradients can have an arbitrary shape in those intervals were no preset value is required, i.e. when no RF-pulses are emitted or data acquisition takes place. Only the physical and technical constraints have to be obeyed. An arbitrary waveform in those regions has the potential advantage that the optimum solution really can be obtained. However, choosing arbitrary functions, for example trigonometric functions, leads to large sets of non-linear constraints in the optimization process and, therefor, to a difficult to parameterize and lengthy optimization procedure.

Figure 3:
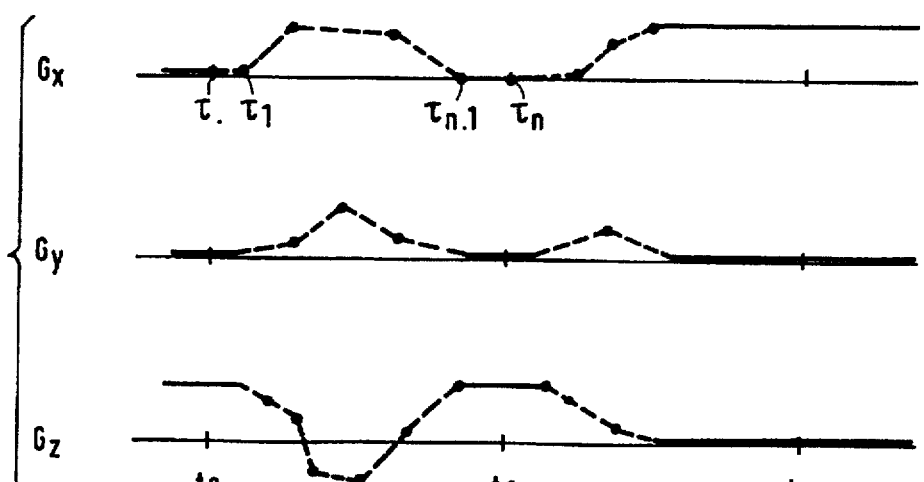
FIG. 3, magnetic field gradient waveforms with piecewise linear functions and non-coincident nodes.

In a third embodiment of the invention the waveforms are also described by piecewise linear functions, but with nodes in the gradient waveforms in the x-, y- and z-directions that do not coincide. An example of such waveforms is given in FIG. 3. In this Figure the rows $G_x$, $G_y$ and $G_z$ indicate the presence of magnetic gradient fields in the x-, y- and z-directions. The fixed portions of the gradient waveforms are indicated by solid lines, the positions that may be varied during the optimization by dashed lines with nodes points. The time-integrated gradient strengths are expressed in terms of the piecewise linear functions, and the physical constraints are expressed in relations between the integrated gradient strengths in different intervals. These time-integrated gradient strengths are composed of the sum over the contribution of each linear piece. For example, the time integrated strength of the x-direction gradient, the measurement gradient, in the interval between the excitation and refocusing pulse of a spin echo sequence can be expressed as:

$$\int_{t_0}^{t_1} F_x(t)dt = 1/2 \sum_{i=0}^{n-1} (Gx_{i+1} + Gx_i)(\tau_{i+1} - \tau_i),$$

in which $Gx_i$ and $\tau_i$ represent the gradient strengths and times of the respective nodes. The nodes with $i=0$ and $i=1$ indicate the center and end of the excitation RF-pulse and the nodes $i=n-1$ and $i=n$ the start and center of the refocusing RF-pulse. These nodes are fixed both regarding the time and the gradient strength. The nodes with $i=2, \ldots, n-2$ are variable both regarding time and gradient strength. Because of the variable strength and time of the variable nodes, all physical constraints result in non-linear relationships, the number of which being independent of the number of variable nodes.

The device constraints can be expressed by: $-M_{mx} \leq Gx_i \leq M_{mx}$ and $$-S_{mx} \leq \frac{Gx_{i+1} - Gx_i}{\tau_{i+1} - \tau_i} \leq S_{mx},$$

with $M_{mx}$ the maximum strength and $S_{mx}$ the maximum slope of the gradient. The constraints on slope are equivalent to: $(Gx_{i+1}-Gx_i)-S_{mx}(\tau_{i+1}-\tau_i) \leq 0$ and $(Gx_{i+1}-Gx_i)+S_{mx}(\tau_{i+1}-\tau_i) \geq 0$, provided that the various nodes are ordered increasing in time: $\tau_{i+1} \geq \tau_i$. Additional constraints are that the preparation phase must be terminated at the same moment in each of the three gradient directions and that during the measurement period the phase encoding and slice selection gradients are switched off.

Figure 4A:
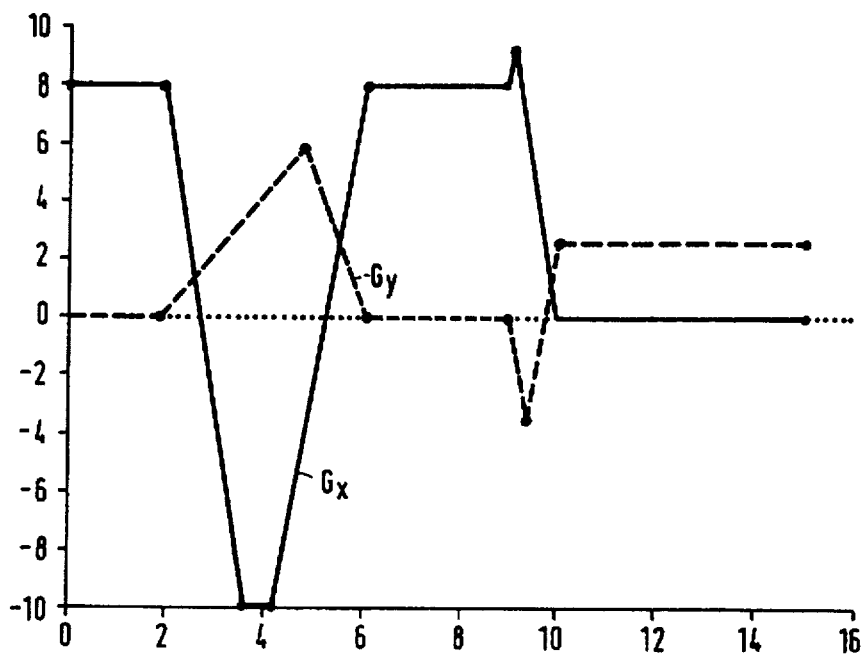
FIGS. 4a and 4b, a few gradient waveforms obtained for a SE sequence.
Figure 4B:
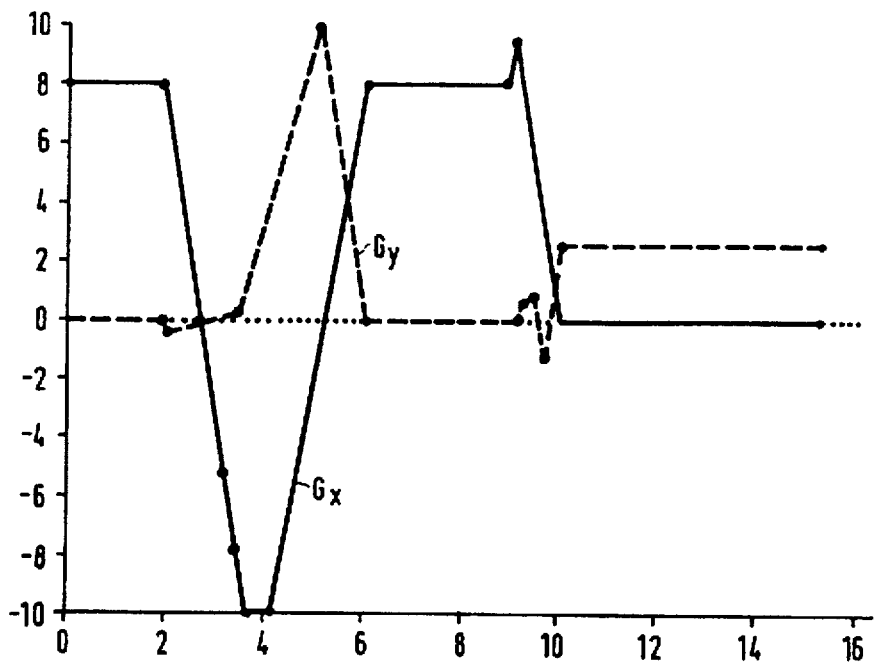

FIGS. 4a and 4b show possible solutions for gradient waveforms for the slice selection and measurement gradients. The waveform shown in FIG. 4a has two variable nodes at both sides of the refocusing RF-pulse and the waveform shown in FIG. 4b has six variable nodes at both sides. As can be seen, substantially the same waveform results from the optimization process. A larger number of variable nodes does result in a better solution but only consumes more computer time. So, a limited number of nodes seems to be sufficient.

In order to avoid magnetic field gradient waveforms which are undesirable from a technical point of view, a penalty function can be introduced. Such penalty function gives a slight preference to a solution with desirable features. So, it selects from a set of substantially equivalent solutions the one with the most desirable features, for example the one with equal gradient strengths at adjacent nodes or the one with a limited change in slope at each node.

In a fourth embodiment the variable nodes have a fixed time relationship imposed upon them, leaving the magnetic field gradient. strength as the only independent variable. This has the advantage that all constraints are linear and, consequently, that the optimization process is very fast. After having fixed the last variable node, the other variable nodes are distributed in the relevant interval at equal distances. In an implementation of this embodiment, the existence of a solution is determined with help of the routine "E04MBF" of the NAG Fortran Library. This method has as a disadvantage that the optimum solution, for example the one with the longest measurement period, if not found directly. If no solution can be reached with the maximum measurement time, but one can be reached with the minimum acceptable measurement time, in this embodiment a binary search is performed to determine the maximum measurement time for which a solution exists. It appears that also in this case, a limited number of variable nodes is sufficient for an acceptable solution. Using a large number of node points can be advantageous as smooth gradient waveforms can be imposed, i.e. the difference in slope between adjacent edges is limited.

In the preceding description it is assumed that the applied magnetic gradients are in the x-, y- and z-directions. In practice however, each set of mutually perpendicular directions can and will be used to allow slices with different orientations to be imaged. The relation between the "machine" directions x, y, z and the image directions m, p, s (measurement, phase encoding and slice selection directions) are (expressed by a rotation:

$$\begin{pmatrix} s_x & m_x & p_x \\ s_y & m_y & p_y \\ s_z & m_z & p_z \end{pmatrix} \begin{pmatrix} F_s(t) \\ F_m(t) \\ F_p(t) \end{pmatrix} = \begin{pmatrix} F_x(t) \\ F_y(t) \\ F_z(t) \end{pmatrix}.$$

The physical constraints then apply to the imaging (m, p, s) system while the technical constraints apply to the machine (x, y, z) system. Apart from the different relationships between gradients as generated in the magnetic resonance device and the effective magnetic field gradients that are present in the body to be imaged, no fundamental differences are created by a rotation of the slice to be imaged. However, the optimization problems change from mainly linear to rather complex and non-linear.

Figure 5A:
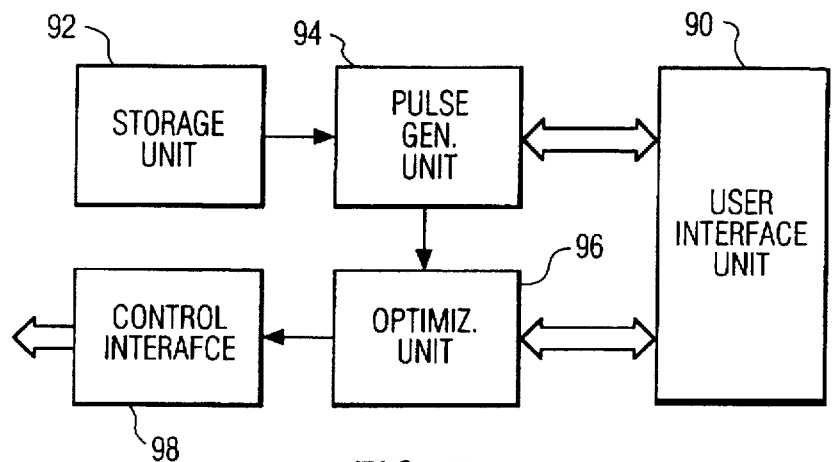
FIGS. 5a and 5b, a functional block diagram displaying the relationships between the different steps in the method according to the invention and a flow diagram illustrating the optimisation procedure.
Figure 5B:
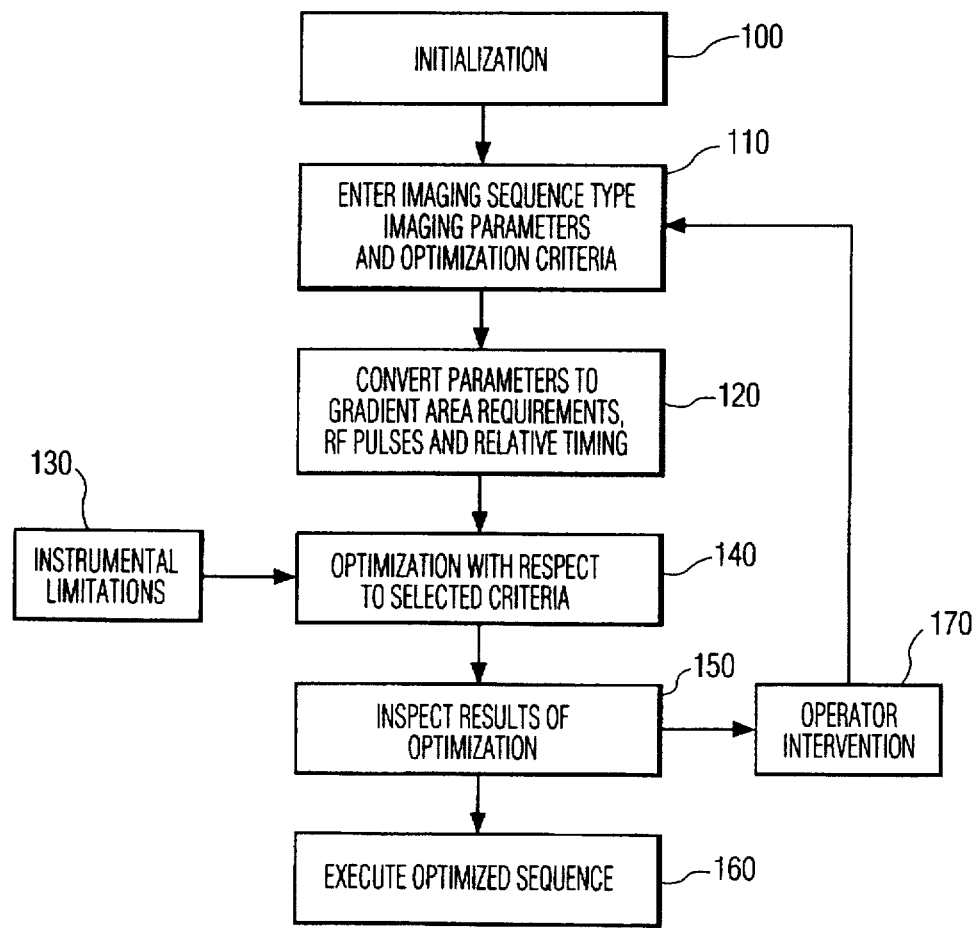

In FIG. 5a shows a block diagram representing the functional relationship between the different steps in the method according to the invention is shown and FIG. 5b shows a flow diagram of the method. The functions will be accommodated in the control unit 12 as shown in FIG. 1. After initialization (box 100) in a user interface unit 90 instructions from an operator are accepted (box 110) to select an elementary pulse sequence and physical relevant parameters such as frame rate and related parameters echo time $T_E$ and repetition time $T_R$, slice thickness and orientation and field-of-view. Also selected are the optimization criteria. In box 120, a global description, retrieved from a storage unit 92 or already contained in the code of a stored computer program, is combined with the specified parameters in pulse generation unit 94 to a global physical description of the pulse sequence, comprising also the constraints that have to be applied. This global physical description contains the areas and relative timing of the various gradient fields. If the RF-pulses themselves are to be included in the optimisation process the global physical description also contains the timing and time-integrated strength thereof. Box 130 indicates the technical constraints that have to be applied. In the optimization unit 96 the details of the sequence are determined according to an optimization procedure (box 140). The results are then transmitted to the operator via user interface 90. The operator can reject the results of the procedure (box 150) amend the constraints (box 170) or impose additional constraints after which the optimisation procedure is repeated. If the operator accepts the results of the optimization procedure, these are then used to control the MRI device via a control interface 98 for imaging (box 160).

The method of the present invention allows a separation between the physical requirements of the MRI-sequence and the detailed description thereof, the latter being determined in the optimisation procedure. As the optimization procedure can be implemented in a general way, a sequence with new or different constraints can be easily implemented.

In practise, the amount of time necessary to perform the optimization procedure is quite acceptable. In a considerable number of optimization runs for 2D and 3D spin echo sequences with different initial values for the parameters, the optimization process took in general less than 10 seconds on a HP9000/735 computer and was only exceptionally not completed within 20 seconds. The results strongly varied with the initial values of the parameters. In a few cases, a set of initial values did not lead to a result, but always there were other sets of initial values for the same sequence and constraints that provided a result.

We claim:

1. Method for magnetic resonance imaging of at least a portion of a body placed in a stationary and substantially homogeneous main magnetic field, the method comprising the following steps:
   selecting an elementary sequence type of RF-pulses and magnetic field gradient pulses for generating magnetic resonance signals in an object from a set of alternative elementary sequence types said selected elementary sequence type not defining values for at least some timing length and strength parameters for the RF-pulses and magnetic field gradient pulses;
   selecting operational parameters which, in combination with the selected elementary sequence type, describe desired imaging characteristics;
   determining particular values for the timing, length and strength parameters not defined by the selected elementary sequence type to form an operational sequence of RF-pulses and magnetic field gradient pulses by optimization of values for the timing, length and strength parameters not defined by said selected elementary sequence type, taking into account machine constraints and said operational parameters;
   subjecting said portion of a body to said operational sequence thereby generating magnetic resonance signals in said portion; and
   measuring said magnetic resonance signals and obtaining from said measured signals an image of said portion of the body.

2. Method for magnetic resonance imaging as claimed in claim 1, wherein the step of selecting operational parameters is functionally separated from the optimization of the selected elementary sequence type.

3. Method for magnetic resonance imaging as claimed in claim 2, wherein the operational sequence is determined by an optimization of the elementary sequence type by substantially maximizing a signal-to-noise ratio to be expected therein.

4. Method for magnetic resonance imaging according to claim 3, wherein first, from said elementary sequence type a general description of the operational sequence is determined, said general description comprising timing of RF-pulses and strength of magnetic field gradients applied simultaneously with the RF-pulses and second, the optimization is performed for determining a magnetic field gradient waveform in intervals not provided for in said general description.

5. Method for magnetic resonance imaging according to claim 3, wherein first from said elementary sequence type a general description of the operational sequence is determined and second, the optimization is performed for determining timing, length and strength of RF-pulses and magnetic field gradient waveforms.

6. Method for magnetic resonance imaging according to claim 5, wherein the magnetic field gradient waveforms are piecewise linear functions.

7. Method for magnetic resonance imaging as claimed in claim 3, wherein the signal-to-noise ratio is substantially maximized by maximizing a period for measuring the generated magnetic resonance signals.

8. Method for magnetic resonance imaging according to claim 2, wherein first, from said elementary sequence type a general description of the operational sequence is determined, said general description comprising timing of RF-pulses and strength of magnetic field gradients applied simultaneously with the RF-pulses and second, the optimization is performed for determining a magnetic field gradient waveform in intervals not provided for in said general description.

9. Method for magnetic resonance imaging according to claim 2, wherein first from said elementary sequence type a general description of the operational sequence is determined and second, the optimization is performed for determining timing, length and strength of RF-pulses and magnetic field gradient waveforms.

10. Method for magnetic resonance imaging according to claim 9, wherein the magnetic field gradient waveforms are piecewise linear functions.

11. Method for magnetic resonance imaging as claimed in claim 1, wherein the operational sequence is determined by an optimization of the elementary sequence type by substantially maximizing a signal-to-noise ratio to be expected therein.

12. Method for magnetic resonance imaging according to claim 11, wherein first, from said elementary sequence type a general description of the operational sequence is determined, said general description comprising timing of RF-pulses and strength of magnetic field gradients applied simultaneously with the RF-pulses and second, the optimization is performed for determining a magnetic field gradient waveform in intervals not provided for in said general description.

13. Method for magnetic resonance imaging according to claim 11, wherein first from said elementary sequence type a general description of the operational sequence is determined and second, the optimization is performed for determining timing, length and strength of RF-pulses and magnetic field gradient waveforms.

14. Method for magnetic resonance imaging according to claim 13, wherein the magnetic field gradient waveforms are piecewise linear functions.

15. Method for magnetic resonance imaging as claimed in claim 11, wherein the signal-to-noise ratio is substantially maximized by maximizing a period for measuring the generated magnetic resonance signals.

16. Method for magnetic resonance imaging according to claim 1, wherein first, from said elementary sequence type a general description of the operational sequence is determined, said general description comprising timing of RF-pulses and strength of magnetic field gradients applied simultaneously with the RF-pulses and second, the optimization is performed for determining a magnetic field gradient waveform in intervals not provided for in said general description.

17. Method for magnetic resonance imaging according to claim 1, wherein first from said elementary sequence type a general description of the operational sequence is determined and second, the optimization is performed for determining timing, length and strength of RF-pulses and magnetic field gradient waveforms.

18. Method for magnetic resonance imaging according to claim 17, wherein the magnetic field gradient waveforms are piecewise linear functions.

19. Device for magnetic resonance imaging of a body under examination when placed in an examination zone comprising means for establishing a stationary and substantially homogeneous main magnetic field in the examination zone, means for generating gradient magnetic fields superimposed upon the main magnetic field, means for radiating RF-pulses towards the body, control means for steering generation of the gradient magnetic fields and the RF-pulses, means for receiving and sampling magnetic resonance signals generated by sequences of RF-pulses and switched gradient magnetic fields, and reconstruction means for forming an image from the received and sampled magnetic resonance signals, said control means further comprising:

a general description of a limited number of elementary sequences, said general description not defining values for at least some timing, length and strength parameters for the RF-pulses and gradient magnetic fields;

an operator input section for entering operational parameters describing desired characteristics of images to be obtained and for selecting an elementary sequence; and calculation means for determining particular values for the timing, length and strength parameters not defined by the general description of the selected elementary sequence to form an operational sequence of RF and magnetic field gradient pulses by optimization of values for the timing, length and strength parameters not defined for said selected elementary sequence, taking into account machine constraints and said operational parameters.

20. Device for magnetic resonance imaging according to claim 19, wherein the control means comprises an output for communicating to the operator the result of optimization of the sequence and for allowing the operator to apply additional parameters.

* * * * *